United States Patent
Park et al.

(10) Patent No.: US 7,292,070 B1
(45) Date of Patent: Nov. 6, 2007

(54) PROGRAMMABLE PPM DETECTOR

(75) Inventors: Seungmyon Park, Sunnyville, CA (US); Ramanand Venkata, San Jose, CA (US); Chong Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 156 days.

(21) Appl. No.: 11/200,579

(22) Filed: Aug. 9, 2005

Related U.S. Application Data

(60) Provisional application No. 60/699,822, filed on Jul. 14, 2005.

(51) Int. Cl.
*G01R 23/02* (2006.01)
*H03D 3/00* (2006.01)
*H03K 9/06* (2006.01)

(52) U.S. Cl. .............................. 327/47; 327/48; 327/49

(58) Field of Classification Search ............. 327/47–49, 327/40–43, 144–146, 151
See application file for complete search history.

(56) References Cited

U.S. PATENT DOCUMENTS

| | | | |
|---|---|---|---|
| 3,786,358 A * | 1/1974 | Fiorino | 327/42 |
| 5,307,028 A * | 4/1994 | Chen | 331/1 A |
| 5,689,195 A | 11/1997 | Cliff et al. | |
| 5,909,126 A | 6/1999 | Cliff et al. | |
| 6,215,326 B1 | 4/2001 | Jefferson et al. | |
| 6,320,469 B1 * | 11/2001 | Friedberg et al. | 331/1 A |
| 6,362,693 B2 * | 3/2002 | Unterricker | 331/11 |
| 6,407,576 B1 | 6/2002 | Ngai et al. | |
| 6,563,346 B2 * | 5/2003 | Abbiate et al. | 327/48 |
| 6,650,140 B2 | 11/2003 | Lee et al. | |
| 6,707,329 B2 * | 3/2004 | Shenoi | 327/156 |
| 6,859,107 B1 * | 2/2005 | Moon et al. | 331/11 |
| 6,983,028 B2 * | 1/2006 | Ahn | 375/326 |
| 7,102,446 B1 * | 9/2006 | Lee et al. | 331/11 |
| 7,154,305 B2 * | 12/2006 | Driediger et al. | 327/47 |
| 2001/0033188 A1 | 10/2001 | Aung et al. | |
| 2006/0165204 A1 * | 7/2006 | Shumarayev et al. | 375/371 |

* cited by examiner

*Primary Examiner*—Linh My Nguyen
*Assistant Examiner*—Patrick O'Neill
(74) *Attorney, Agent, or Firm*—Brian E. Mack; Ropes & Gray LLP

(57) ABSTRACT

A device such as a programmable logic device ("PLD") includes circuitry for detecting the PPM frequency difference between two input clock signals. For example, this circuitry may accept a user-programmable PPM threshold value and output a signal when this threshold value is met.

13 Claims, 8 Drawing Sheets

PROGRAMMABLE PPM DETECTOR

CROSS-REFERENCE TO RELATED APPLICATIONS

This application claims the benefit of U.S. provisional Patent Application No. 60/699,822 filed Jul. 14, 2005, which is hereby incorporated by reference herein in its entirety.

BACKGROUND OF THE INVENTION

This invention relates generally to field programmable gate array ("FPGA") integrated circuit devices, such as programmable logic devices ("PLDs"), and more particularly to programmable circuitry for measuring the PPM (parts per million) frequency difference between two input clocks and related operating methods for such devices.

PLDs are well-known devices as shown, for example, by such references as Cliff et al. U.S. Pat. No. 5,689,195, Cliff et al. U.S. Pat. No. 5,909,126, Jefferson et al. U.S. Pat. No. 6,215,326, and Ngai et al. U.S. Pat. No. 6,407,576. In general, a PLD is a general-purpose integrated circuit device that is programmable to perform any of a wide range of logic tasks. PLD technology is well-known for its ability to allow one common hardware design to be programmed to meet the needs of many different applications. Rather than having to design and build separate logic circuits for performing different logic tasks, general-purpose PLDs can be programmed in various different ways to perform those various logic tasks. Many manufacturers of electronic circuitry and systems find PLDs to be an advantageous way to provide system components because they can be manufactured in large quantities at low cost.

The performance of FPGA architectures has increased remarkably in recent years. FPGA integrated circuit devices are now used in a multitude of high-speed applications, such as high-speed serial interfaces ("HSSIs"). These interfaces often process serial input data at rates in excess of 1 Gbps and may additionally recover embedded clock information from these high-speed serial data signals. For example, Lee et al. U.S. Pat. No. 6,650,140, shows a PLD that includes HSSI circuitry that can support several high speed serial ("HSS") standards. Some of these standards, including the XAUI standard, specify multiple channels of clock data recovery ("CDR") data. As shown in Aung et al. U.S. Patent Application Publication No. 20010033188, filed Mar. 13, 2001, CDR circuitry may be used to recover an embedded clock signal from a serial data stream by using a reference clock and a feedback clock.

CDR signaling is now being used in many different signaling protocols and applications. These protocols and applications vary with respect to such parameters as clock signal frequency, header configuration, packet size, data word length, number of parallel channels, etc. In addition, these protocols and applications may each specify a different requirement for acceptable PPM frequency threshold between the reference and feedback clocks before data recovery may begin.

Clock frequency detectors, especially PPM threshold detectors, are areas in which it would be highly desirable to have a programmable solution to avoid building specific detectors for the plethora of different applications.

SUMMARY OF THE INVENTION

In accordance with embodiments of the invention, PPM detector core circuitry of a PLD includes frequency difference circuitry for measuring the PPM difference of two input clock signals. Although the preferred embodiment of the invention may be implemented using one or more PLDs, programmable logic arrays (PLAs and/or PALs) are used in other embodiments. For added flexibility, in at least some embodiments, the PPM detector circuitry may operate in three distinct modes of operation with additional programmability within each mode of operation.

PPM detector core circuitry determines whether the PPM difference between its two clock sources is less than or equal to some PPM threshold value. Preferably, in at least some embodiments, this PPM threshold value is a user-programmable parameter.

In determining the PPM difference, frequency difference circuitry may analyze the outputs of clock counter circuitry. Frequency difference circuitry may create a PPM measurement pulse whose length represents the difference between the PPM detector's two input clocks. This pulse length may then be measured relative to a known reference clock using PPM counter circuitry. The PPM counter circuitry output may then be used by internal logic to determine whether the frequency threshold has been met. If so, a frequency lock signal output indicates this condition.

In some embodiments of the invention, the frequency lock signal may be utilized by a variety of applications, including CDR signaling applications. For example, as described in more detail herein, the frequency lock signal generated by the PPM detector may be used as the lock-to-data ("LTD") signal within CDR circuitry. This signal may indicate to CDR circuitry that a phase locked loop ("PLL") lock has been achieved and the PPM frequency threshold has been met. The CDR circuitry may then move into the data recovery mode.

The invention also includes methods of operating circuitry of the types summarized above.

Further features of the invention, its nature and various advantages, will become more apparent from the accompanying drawings and the following detailed description.

DETAILED DESCRIPTION

Figure 1:
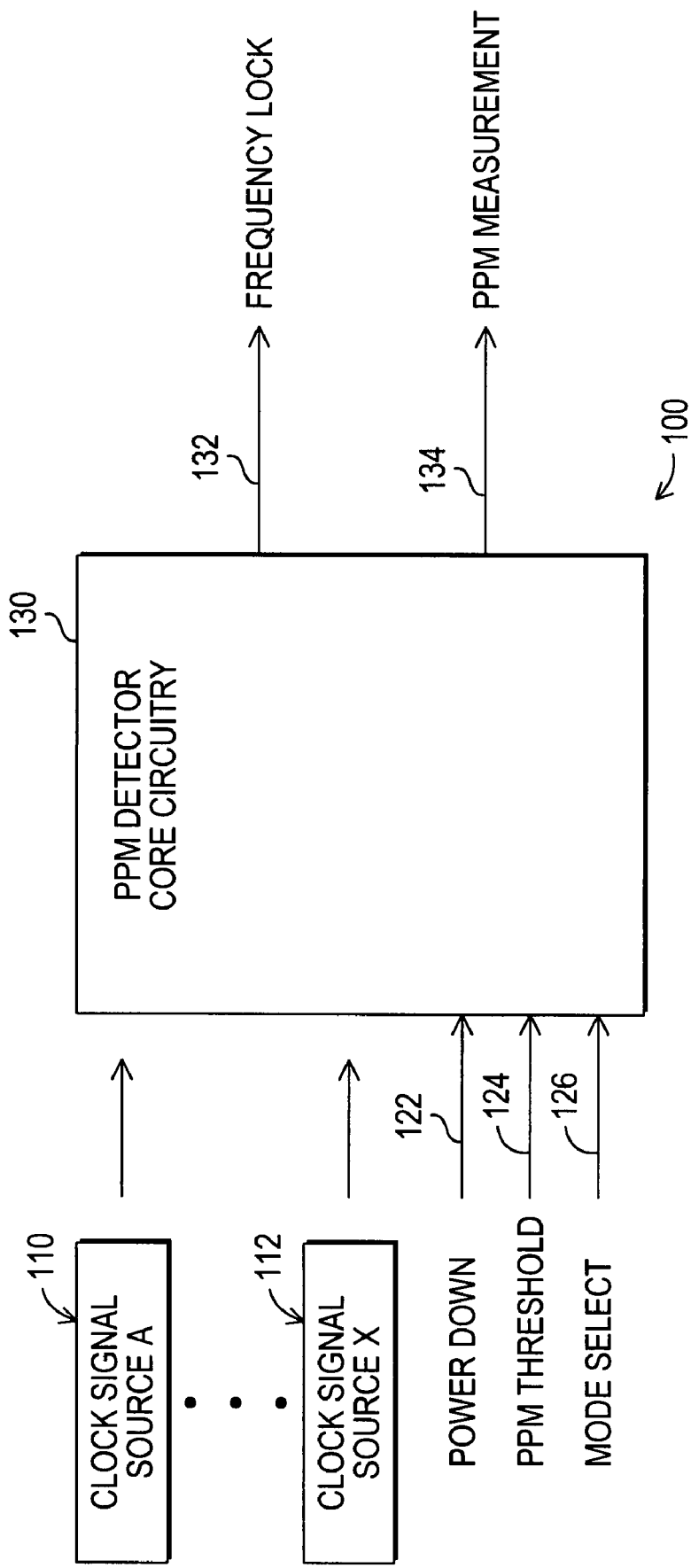
FIG. 1 is a simplified block diagram of an illustrative programmable logic device constructed in accordance with the invention.

An illustrative PLD 100 constructed in accordance with the invention is shown in FIG. 1. PLD 100 is an integrated circuit that includes PPM detector core circuitry 130. PPM detector core circuitry 130 can comprise typical programmable logic circuitry of any of several known types and constructions. Although in the preferred embodiment one or more PLDs are used, the invention may be implemented using one or more PLAs/PALs in other embodiments.

PPM detector core circuitry 130 may receive several inputs. These inputs may include any number of clock sources, including clock signal source A 110 and clock signal source X 112. Although only two clock sources are depicted in FIG. 1, PPM detector core circuitry 130 may receive any number and any type of signal inputs. These inputs may include reference clocks, whose frequencies are known (or known to some degree or scale factor thereof), clocks with unknown frequencies, variable frequency clocks, etc.

PPM detector core circuitry 130 may also receive power down signal 122, which allows PPM detector core circuitry 130 (or some component thereof) to be turned off if it is not going to be used. Internal or external reset signals (not shown) may also allow PPM detector core circuitry 130 (or some component thereof) to be reset in a controlled manner.

Outputs of PPM detector core circuitry 130 may include frequency lock signal 132 and PPM measurement signal 134. Frequency lock signal 132 is asserted whenever PPM detector core circuitry 130 determines that the PPM threshold is met between the two input clock signals. The value of this PPM threshold may be programmable via PPM threshold lead(s) 124, and the following table summarizes possible PPM threshold values in an illustrative embodiment.

| PPM Threshold Lead(s) | PPM Threshold (PPM) |
| --- | --- |
| 0 | ±62.5 |
| 1 | ±100 |
| 2 | ±125 |
| 3 | ±200 |
| 4 | ±250 |
| 5 | ±300 |
| 6 | ±500 |
| 7 | ±1000 |

As described in more detail below, PPM detector core circuitry 130 is responsible for comparing its two input clocks, including clock signal source A 110 and clock signal source X 112. Most fundamentally, PPM detector core circuitry 130 asserts the output on frequency lock signal 132 when the PPM threshold between its two input clocks is met. After each PPM threshold measurement, PPM detector core circuitry 130 may also provide the current PPM threshold value on PPM measurement signal 134.

PPM detector circuitry may also include various inputs and outputs for testing as well as extensive synchronization for the input clock domains to prevent metastable behavior.

For added flexibility, PPM detector core circuitry 130 may be largely programmable. For example, programmable parameters may be stored in one or more function control elements ("FCEs") (e.g., programmable memory cells). In addition to a user-programmable PPM threshold setting, several user-programmable modes of operation may be defined via mode select signal 126. These modes of operation (as described in more detail below), may simplify incorporation of PPM detector core circuitry 130 into various applications, including the aforementioned CDR application.

Figure 2:
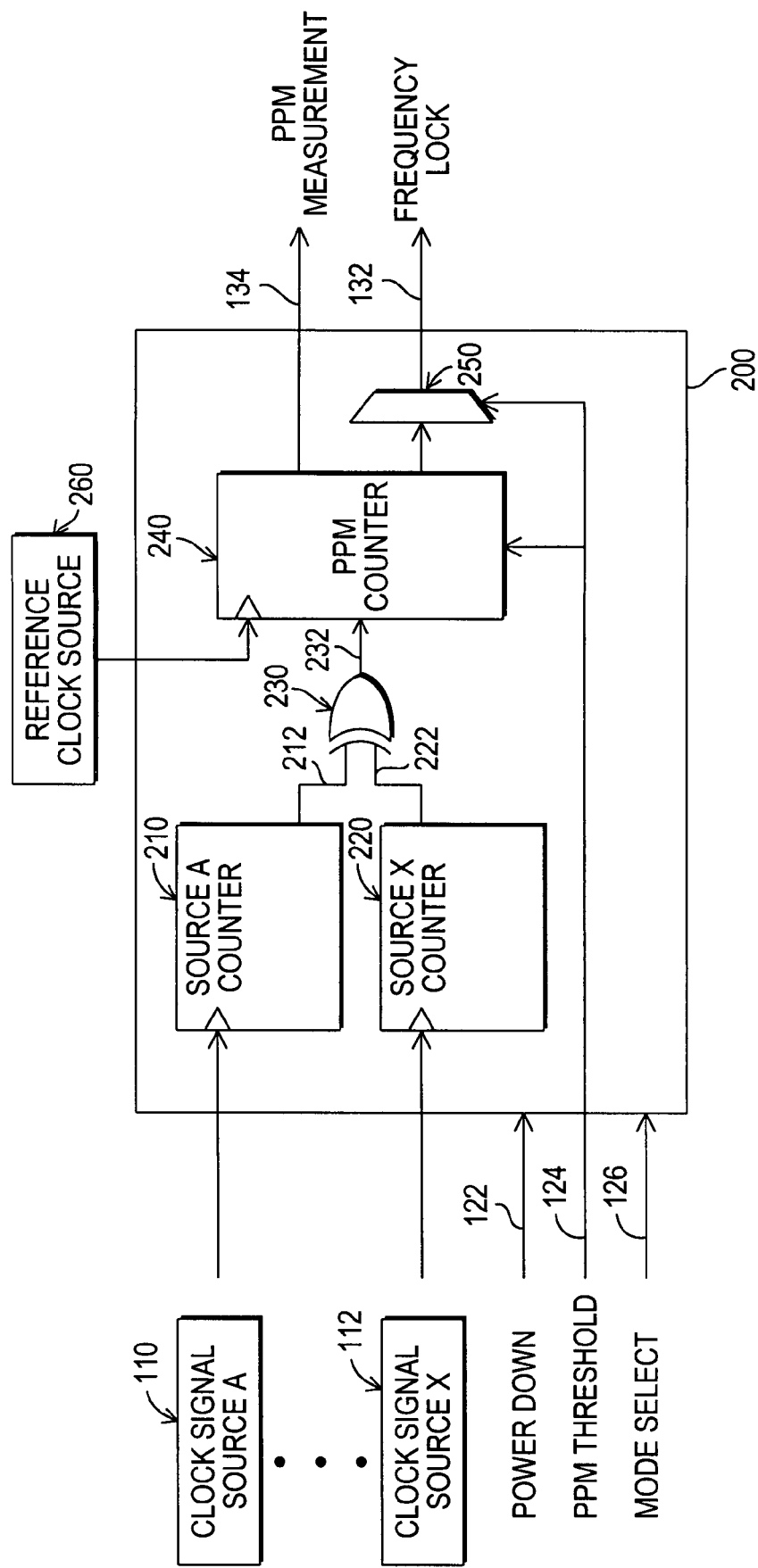
FIG. 2 is a simplified schematic block diagram of an illustrative embodiment of a representative portion of the circuitry shown in FIG. 1 in accordance with the invention.

A representative portion of the PPM detector circuitry shown in FIG. 1 is depicted in FIG. 2. In the default measurement mode (when mode select signal 126 is set to 0), the output from clock signal source A 110 is applied to 16-bit source A counter 210. Similarly, the output from clock signal source X 112 is applied to 16-bit source X counter 220. Once power down signal 122 is de-asserted, source A counter 210 and source X counter 220 start counting based on the two input clock sources. The outputs 212 and 222 of source A counter 210 and source X counter 220 hold the value 0 until an overflow or count done condition is achieved (e.g., the value 32768 is reached). When each counter reaches this condition, the counter's output is switched to 1. Optionally, internally generated reset signals (not shown) may reset source A counter 210 and source X counter 220 when a clock condition, such as a clock done or clock overflow condition, is reached by one or both counters.

Outputs 212 and 222 are received by XOR gate 230. Since clock signal source A 110 and clock signal source X 112 are assumed to exhibit different frequencies, output 232 of XOR gate 230 will be a pulse of some finite duration. The pulse duration represents the amount of time between the completion of the counter with the faster clock input and the completion of the counter with the slower clock input. In this way, PPM circuitry 200 may detect the frequency difference between its two clock inputs.

Output 232 of XOR gate 230 is received by PPM counter 240. PPM counter 240 may measure the PPM threshold value relative to reference clock source 260. Typically, reference clock source 260 will comprise either clock signal source A 110 or clock signal source X 112; however, reference clock source 260 may be any suitable clock with a known or unknown frequency. PPM counter 240 may output each PPM threshold measurement from PPM circuitry 200 via PPM measurement signal 134. This measurement signal may be used for testing or used in conjunction with other circuitry or applications for further processing. The output of PPM counter 240 is also received by internal logic 250. Internal logic 250 or PPM counter 240 may receive the user-programmable PPM threshold signal 124. Internal logic 250 or PPM counter 240 signals when the user-programmed PPM threshold between clock signal source A 110 and clock signal source X 112 is met by asserting frequency lock signal 132.

Figure 3:
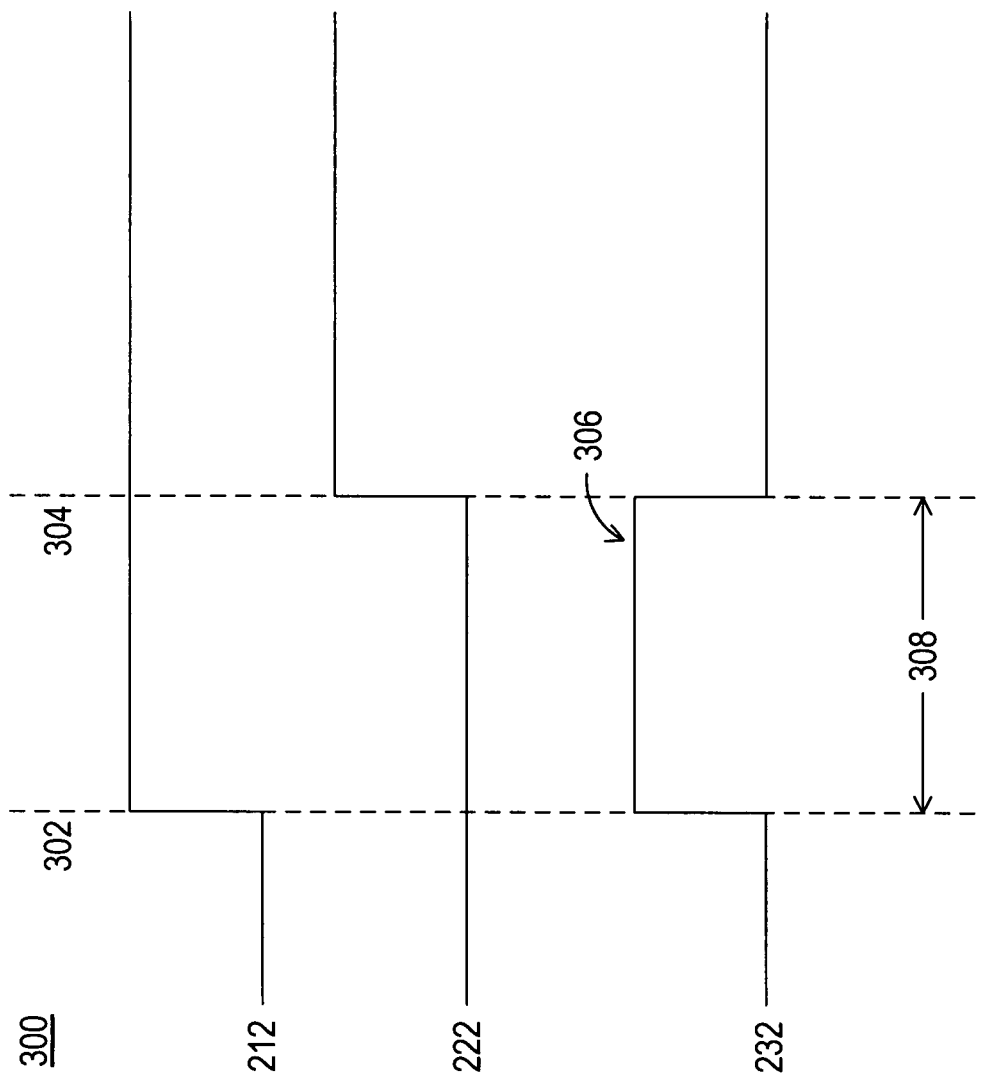
FIG. 3 is an illustrative timing diagram in accordance with the invention.

FIG. 3 shows timing diagram 300 of the outputs of source A counter 210, source X counter 202, and XOR gate 230 of FIG. 2. At some time 302, output 212 from source A counter 210 goes high. This indicates a count done or overflow condition for source A counter 210. At some later time 304, output 222 from source X counter 222 goes high. Similarly, this indicates another count done or overflow condition for source X counter 220. These two signals, when fed into XOR gate 230, result in signal 232. Output 232 of XOR gate 230 comprises pulse 306. The width 308 of pulse 306 represents the difference in clock speed of clock signals 212 and 222.

Figure 4:
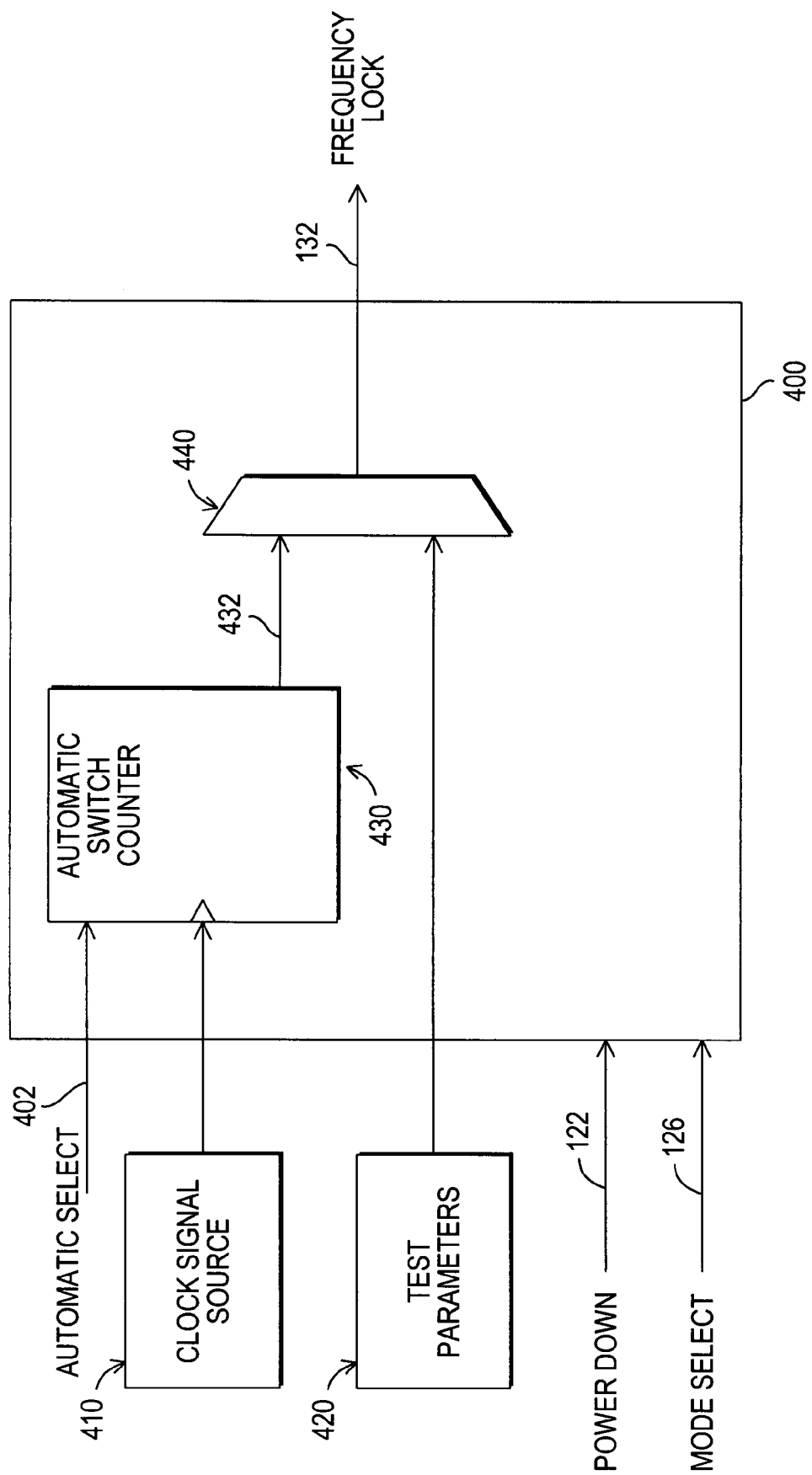
FIG. 4 is a simplified schematic block diagram of an illustrative embodiment of another portion of the circuitry shown in FIG. 1 in accordance with the invention.

FIG. 4 shows a portion of PPM circuitry 400 for use in auto-switch mode (when mode select 126 is set to 1). This mode allows the user to toggle frequency lock signal 132 after a programmed number of clock cycles regardless of whether the PPM threshold criteria has been met. In this mode, clock signal source 410 and automatic select signal 402 are received by 18-bit automatic switch counter 430. Clock signal source 410 is typically some reference clock with a known frequency, but any convenient clock may be used as a source in this mode. Once power down signal 122 is de-asserted, automatic switch counter 430 begins counting to the value specified by automatic select signal 402. Once this value, which may be user-programmable, is reached, output 432 of automatic switch counter 430 switches from 0 to 1. Typically, output 432 of automatic switch counter 430 toggles once. Thus, automatic switch counter 430 may not depend on internal counter reset signals; however, the use of reset signals may effect toggling of output 432 at regular intervals. The following table summarizes possible auto-switch counter threshold values along with the corresponding automatic select signal 402 value in an illustrative embodiment.

| Automatic Select Signal | Counter Threshold Value |
| --- | --- |
| 0 | 0 |
| 1 | $2^8 - 1$ |
| 2 | $2^{14} - 1$ |
| 3 | $2^{18} - 1$ |

Output 432 of automatic switch counter 430 may be received by internal logic 440 for processing. Optionally, test parameters 420, which are preferably programmed by the user (e.g., using FCEs), are also received by internal logic 440 to test or troubleshoot operation or output of frequency lock signal 132 or some other output of PPM circuitry 400. For example, test parameters 420 may include a force high or force low parameter. Internal logic 440 may use these parameters to output a constant low or high value for frequency lock signal 132.

Figure 5:
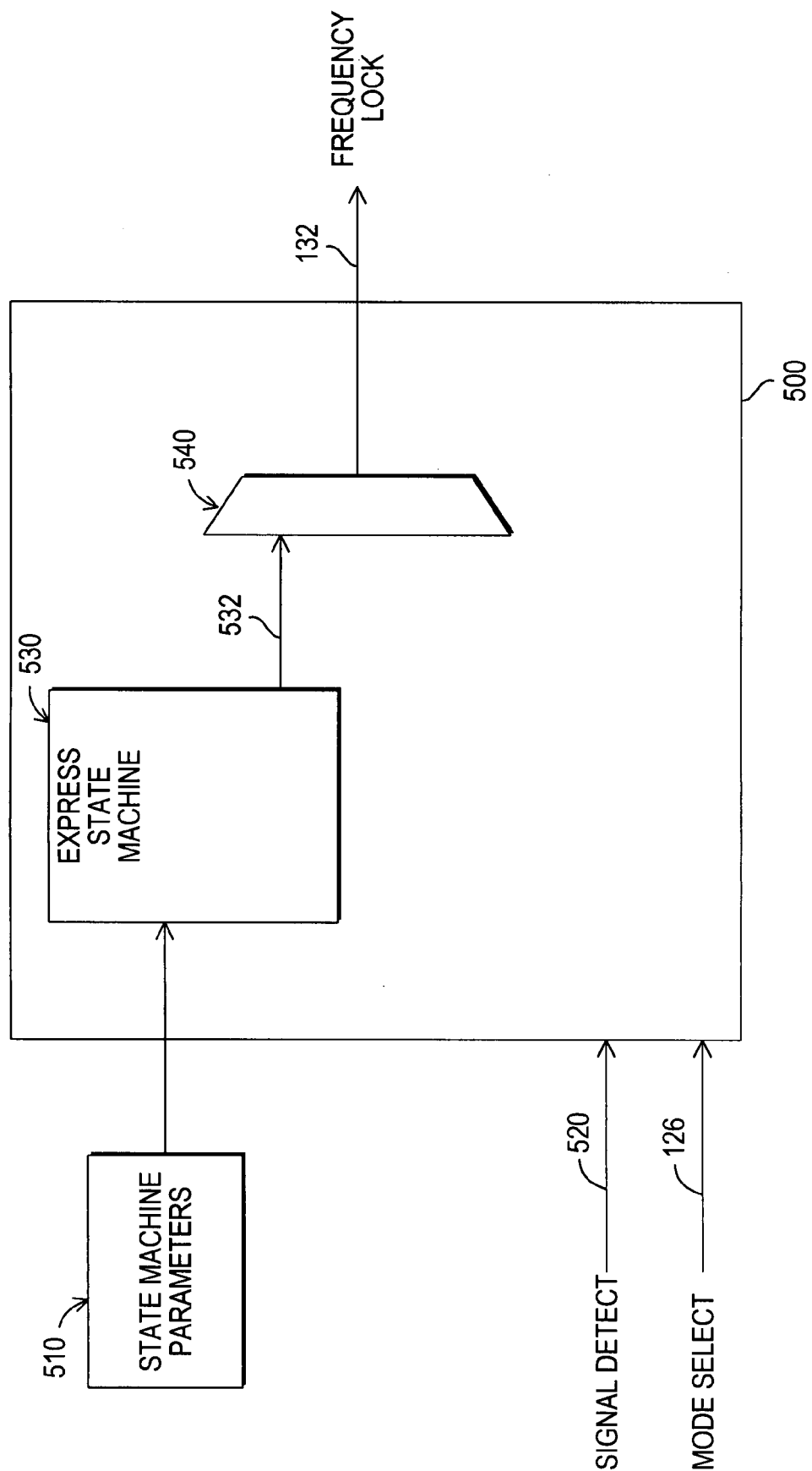
FIG. 5 is a simplified schematic block diagram of an illustrative embodiment of yet another portion of the circuitry shown in FIG. 1 in accordance with the invention.

FIG. 5 shows a portion of circuitry for use in another mode of operation referred to as express mode (when mode select 126 is set to 2). This mode may be useful for quick recovery from low power states. For example, during a PCI Express ("PCIe") low power state, one or both input clocks of PPM circuitry 500 may drift, causing the PPM threshold to be exceeded. This drifting may cause frequency lock signal 132 to toggle. In certain applications of the invention, such as the HSSI CDR application previously described, frequency lock signal 132 must be reasserted after low-power conditions under strict time constraints (e.g., as soon as the transmitter starts transmitting valid data).

In order to quickly recover from such low-power and other clock-skewing states, frequency lock signal 132 may be defined by express state machine 530. By utilizing express state machine 530, the value of frequency lock signal 132 is determined by signal detect 520. When an electrical idle state is detected, signal detect 520 is de-asserted. Once the electrical idle state is exited, signal detect is asserted. Since signal detect 520 may be implemented in a variety of ways, including, for example, via analog level-detection circuitry or a digital disparity error counter, additional various state machine parameters 510 are defined to ensure a consistent behavior of frequency lock 552.

Express state machine 530 may receive various state machine parameters 510, which are preferably user-programmable (e.g., using FCEs) and may include, for example, a specified number of reference clock cycles to keep frequency lock signal 132 low and a specified number of reference clock cycles to keep frequency lock signal 132 high. Express state machine 530 dictates that when signal detect is asserted and the specified number of low clock cycles is met, the value of frequency lock 132 is also asserted. Frequency lock 132 remains asserted until signal detect 520 is de-asserted and the user-specified number of high clock cycles is met. Output 532 of express state machine 530 may be received by internal logic 540 before being output as frequency lock signal 132.

Thus, for example, in the CDR application previously described, a user can guarantee that the CDR will remain in lock-to-reference mode (frequency lock signal 132 is de-asserted) long enough to achieve frequency locking. In addition, by forcing the CDR to remain in lock-to-data mode (frequency lock signal 132 is asserted) for a specified number of clock cycles, glitches and jitter on signal detect 520 can be filtered out. This behavior may prevent false switching between lock-to-data and lock-to-reference modes of the CDR.

Figure 6:
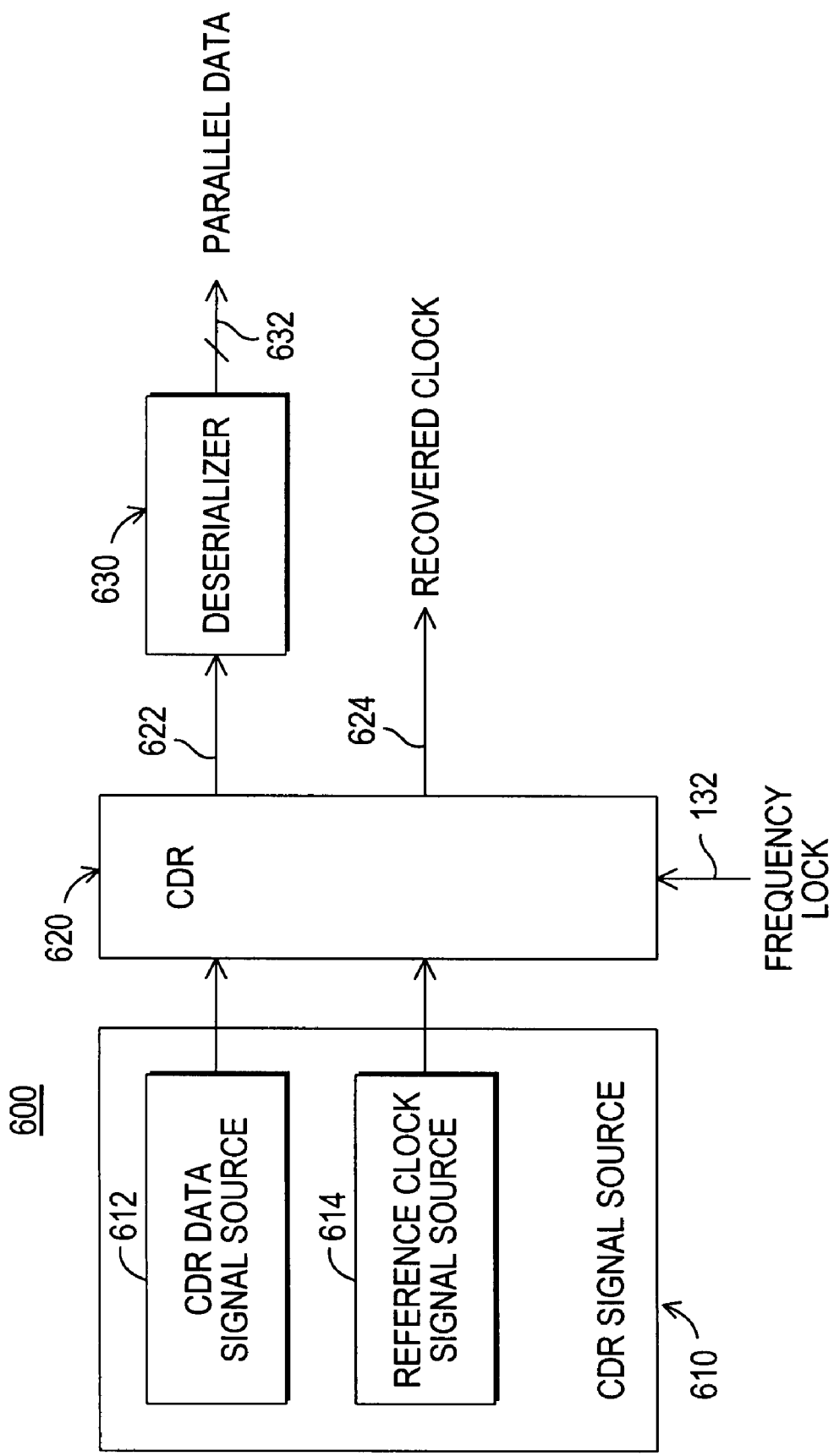
FIG. 6 is a simplified block diagram of an illustrative application of the FIG. 1 apparatus in accordance with the invention.

FIG. 6 show one illustrative application 600 of the invention in more detail. CDR signal source 610 may comprise CDR data signal source 612 and reference clock signal source 614. CDR circuitry 620 may receive both of these signal sources as well as frequency lock signal 132. CDR circuitry 620 may attempt recovery of the embedded clock signal of CDR data signal source 612. Typically, recovery of the embedded clock is accomplished using a phase locked loop ("PLL") within CDR circuitry 620. At some point, CDR circuitry 620 outputs a recovered clock signal on lead 624 and begins data recovery on lead 622. Optionally, these signals may be applied to deserializer 630, which converts the applied retimed serial data to parallel data 632.

Figure 7:
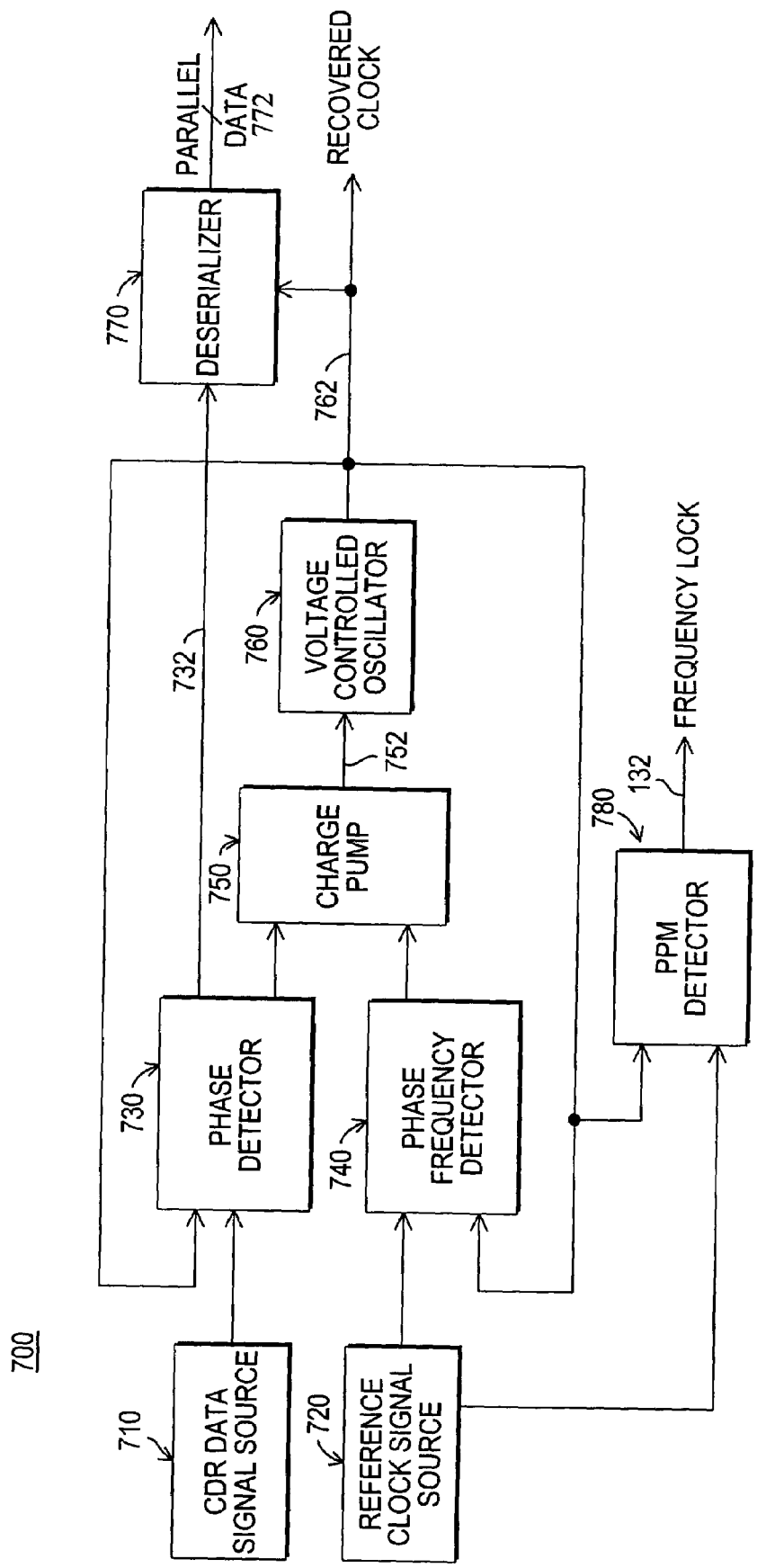
FIG. 7 is a more detailed, yet still simplified, block diagram of what is shown in FIG. 6 in accordance with the invention.

FIG. 7 shows the CDR application of FIG. 6 in more detail. Although CDR circuitry will be described briefly herein, the exact methods and systems for performing CDR are beyond the scope of this discussion. For a more complete description of one implementation of CDR circuitry, see Aung et al. Patent Application Publication No. 20010033188, filed Mar. 13, 2001.

Phase detector 730 receives both CDR data signal source 710 and the feedback clock signal output from voltage controlled oscillator ("VCO") 760. Phase detector 730 compares the phases of the signals it receives and produces an output signal for charge pump 750. The output signal from phase detector 730 indicates if the feedback clock signal needs to be speeded up or slowed down to work better with the phase transitions in CDR data signal source 710.

The lower loop of FIG. 7 is substantially a PLL circuit and will therefore sometimes be referred to as such herein. Phase frequency detector circuit 740 receives the reference clock signal output from reference clock signal source 720. Phase frequency detector circuit 740 compares the phase and frequency of the two signals it receives and outputs a signal indicative of whether the output signal should be speeded up or slowed down to better match the phase and frequency of reference clock signal source 720. Charge pump circuit 750 integrates the output signal of phase frequency detector circuit 740 and produces a VCO current control signal appropriate to controlling VCO 760. The effect is to make the output signal of VCO 760 better match reference clock signal source 720 with regard to phase and frequency. If desired, the recovered clock from VCO 760 may be received by deserializer 770 along with retimed data 732. Deserializer 770 may convert the serial data into parallel data output 772.

At some point, CDR circuitry 700 must switch from lock-to-reference ("LTR") mode (utilizing the lower feedback loop of FIG. 7), to lock-to-data ("LTD") mode (utilizing the upper feedback loop of FIG. 7). CDR data recovery takes place in this latter lock-to-data mode of operation. By integrating PPM detector 780 into CDR circuitry 700, some threshold frequency difference, which may be user-programmable, between reference clock signal source 720 and the PLL feedback clock can be met before the CDR switches modes. Frequency lock signal 132 may be used as the CDR signal for determining when CDR circuitry 700 may move from one stage of operation to another. Although PPM detector 780 as shown in FIG. 7 is integrated with CDR circuitry 700, PPM detector 780 may be wholly or partly on a separate integrated circuit.

Figure 8:
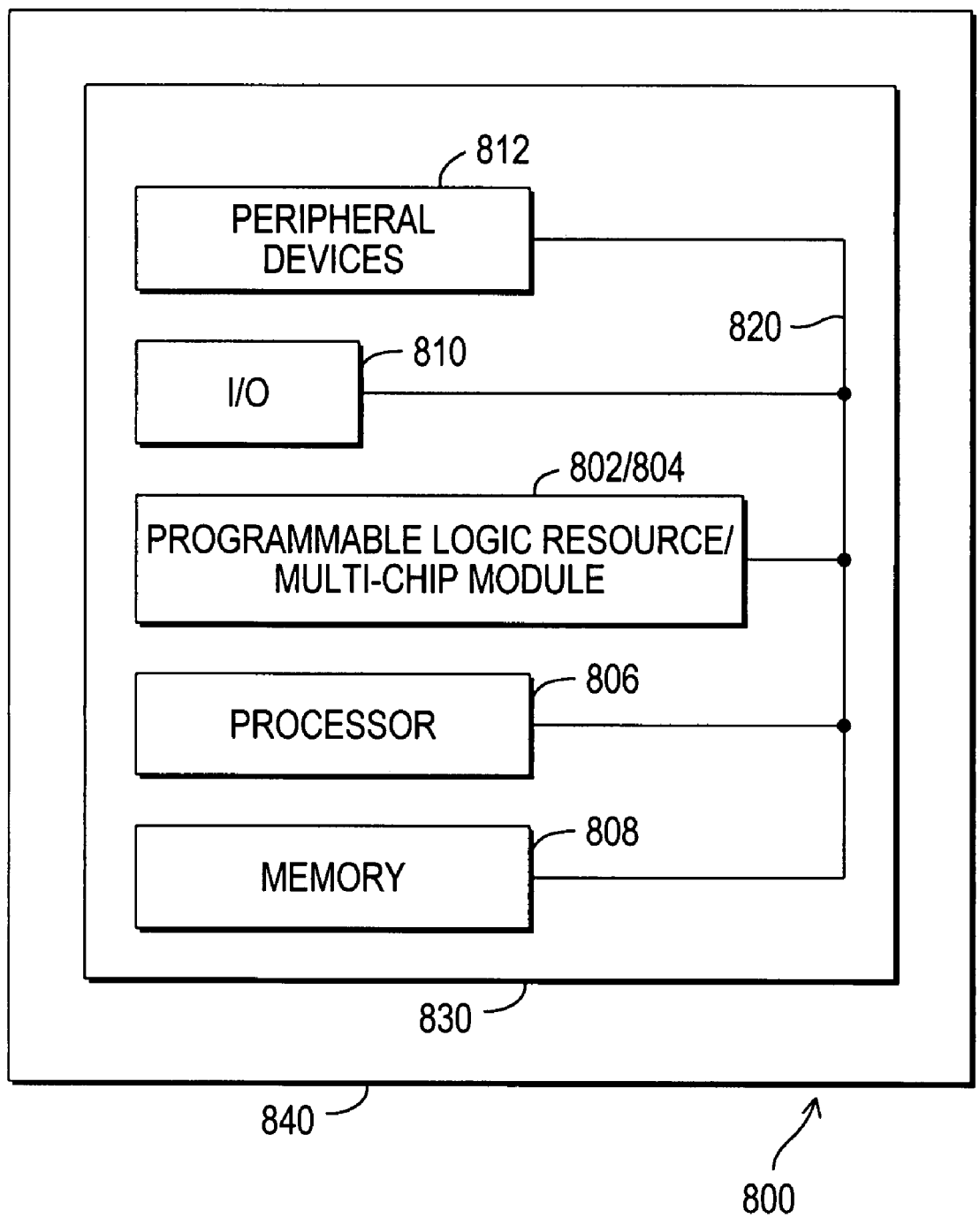
FIG. 8 is a simplified schematic block diagram of an illustrative system employing a programmable logic resource, multi-chop module, or other suitable device in accordance with the invention.

FIG. 8 illustrates programmable logic resource 802, multi-chip module 804, or other device (e.g., ASSP, ASIC, full-custom chip, dedicated chip), in accordance with embodiments of the invention in a data processing system. Data processing system 800 may include one or more of the following components: processor 806, memory 808, I/O circuitry 810, and peripheral devices 812. These components are coupled together by a system bus or other interconnections 820 and are populated on circuit board 830, which is contained in end-user system 840. For example, interconnections 820 may comprise standard PCI, PCI-X, or PCI Express interconnect technology.

It will be understood that the foregoing is only illustrative of the principles of the invention, and that various modifications can be made by those skilled in the art without departing from the scope and spirit of the invention. For example, the CDR application described herein is merely illustrative. Other applications exist which may be equally or better suited to the following claimed invention.

What is claimed is:

1. Circuitry for detecting a frequency difference between clock signals, comprising:
   two clock signal sources;
   frequency difference circuitry to determine the frequency difference between the two clock signal sources, the frequency difference circuitry comprising: at least two counters, wherein each counter has one of the two clock signal sources as an input; and at least one XOR gate responsive to an output of the at least two counters;
   at least one user-programmable input, wherein one of the at least one user-programmable input is indicative of a frequency threshold value; and
   output circuitry configured to signal when the frequency difference is less than or equal to the frequency threshold value.

2. The circuitry defined in claim 1 wherein one of the two clock signal sources is a reference clock and the other of the two clock signal sources is a feedback clock.

3. The circuitry defined in claim 2 wherein the feedback clock is part of clock data recovery (CDR) circuitry.

4. The circuitry defined in claim 1 wherein the frequency difference circuitry measures the frequency difference relative to a reference clock.

5. The circuitry defined in claim 4 wherein the reference clock comprises one of the two clock signal sources.

6. The circuitry defined in claim 1 wherein the output circuitry is further configured to signal when a user-programmable number of clock cycles of one of the two clock signal sources has passed, wherein the at least one user-programmable input comprises the user-programmable number of clock cycles.

7. The circuitry defined in claim 1 wherein one of the at least one user-programmable input is indicative of a mode of operation.

8. The circuitry defined in claim 1 wherein the frequency threshold value is a parts per million (PPM) frequency threshold value.

9. A method of detecting a frequency difference between clock signals, the method comprising:
   receiving a signal indicative of a user-programmable frequency threshold value;
   counting two clock signals using at least two counters;
   feeding an output of the at least two counters into an XOR gate;
   counting an output of the XOR gate;
   comparing the counted output of the XOR gate with the signal indicative of the user-programmable frequency threshold value; and
   in response to the comparing step, signaling when the counted output of the XOR gate is less than or equal to the user-programmable frequency threshold value.

10. The method defined in claim 9 further comprising:
    providing the signal when the output of the XOR gate is less than or equal to the user-programmable frequency threshold value to clock data recovery (CDR) circuitry.

11. The method defined in claim 9 wherein counting two clock signals using at least two counters comprises counting a reference clock and a feedback clock using the at least two counters.

12. The method defined in claim 9 further comprising:
    receiving data indicative of a number of clock cycles; and
    signaling when at least one of the two clock signals has exceeded the number of clock cycles.

13. The method defined in claim 9 wherein the user-programmable frequency threshold value is a parts per million (PPM) frequency threshold value.

* * * * *